(12) United States Patent
Umeda et al.

(10) Patent No.: US 12,721,093 B2
(45) Date of Patent: Aug. 25, 2026

(54) METHOD OF MANUFACTURING SEMICONDUCTOR DEVICE, SUBSTRATE PROCESSING METHOD, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Aiko Umeda, Toyama (JP); Tsukasa Yashima, Toyama (JP); Yoshihiko Nakagawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 944 days.

(21) Appl. No.: 17/953,516

(22) Filed: Sep. 27, 2022

(65) Prior Publication Data

US 2023/0106341 A1 Apr. 6, 2023

(30) Foreign Application Priority Data

Sep. 27, 2021 (JP) ................................ 2021-156450

(51) Int. Cl.
*H10P 72/00* (2026.01)
*F27B 17/00* (2006.01)
(Continued)

(52) U.S. Cl.
CPC ...... *H10P 72/0604* (2026.01); *F27B 17/0025* (2013.01); *F27D 11/12* (2013.01);
(Continued)

(58) Field of Classification Search
None
See application file for complete search history.

(56) References Cited

U.S. PATENT DOCUMENTS

2014/0358140 A1* 12/2014 Emmons ............ A61B 18/1815 606/33
2018/0090397 A1* 3/2018 Nakayama ........ H01J 37/32926
(Continued)

FOREIGN PATENT DOCUMENTS

JP 2011066254 A 3/2011
JP 2015070045 A 4/2015
(Continued)

OTHER PUBLICATIONS

Letter of Examination Report with English translation in Taiwan Application No. 111131599, dated Aug. 17, 2023, 16 pages.
(Continued)

*Primary Examiner* — Alexander G Ghyka
(74) *Attorney, Agent, or Firm* — Edell, Shapiro & Finnan, LLC

(57) ABSTRACT

There is provided a technique capable of stably form the film on a substrate regardless of machine difference or processing conditions. According to an aspect of the present disclosure, there is provided a technique that includes: (a) setting correction coefficients for correcting an output level of microwave; (b) storing correction tables containing the correction coefficients set in (a); (c) acquiring one or more correction coefficients from at least one correction table periodically from a start of outputting of the microwave; (d) calculating a correction value for an output preset level of the microwave from the one or more correction coefficients acquired in (c); (e) correcting the output preset level of the microwave by using the correction value calculated in (d); and (f) processing a substrate by supplying the microwave into a process chamber with the output preset level of the microwave corrected in (e).

13 Claims, 10 Drawing Sheets

(51) Int. Cl.

| | |
|---|---|
| ***F27D 11/12*** | (2006.01) |
| ***H05B 6/64*** | (2006.01) |
| ***H05B 6/80*** | (2006.01) |
| ***H10P 34/42*** | (2026.01) |
| ***H10P 74/00*** | (2026.01) |

(52) U.S. Cl.

CPC ............. *H05B 6/6447* (2013.01); *H05B 6/80* (2013.01); *H10P 34/422* (2026.01); *H10P 72/0436* (2026.01); *H10P 74/23* (2026.01)

(56) References Cited

U.S. PATENT DOCUMENTS

| | | | | |
|---|---|---|---|---|
| 2019/0057844 | A1 | 2/2019 | Kaneko et al. | |
| 2019/0244789 | A1 | 8/2019 | Kaneko et al. | |
| 2019/0267216 | A1* | 8/2019 | Kaneko | H01J 37/32201 |
| 2019/0393056 | A1* | 12/2019 | Hirochi | H01L 21/67017 |
| 2020/0013587 | A1 | 1/2020 | Kaneko et al. | |

FOREIGN PATENT DOCUMENTS

| | | | |
|---|---|---|---|
| JP | 2018067418 | A | 4/2018 |
| JP | 2019036482 | A | 3/2019 |
| KR | 10-2018-0034168 | A | 4/2018 |
| KR | 10-2019-0067223 | A | 6/2019 |
| TW | 201130399 | A | 9/2011 |

OTHER PUBLICATIONS

Notice of Submission of Opinions with English translation in Korean Application No. 10-2022-0119838, dated Jul. 5, 2024, 14 pages.

Notice of Reasons for Refusal with English translation in Japanese Application No. 2021-156450, dated Apr. 20, 2023, 4 pages.

* cited by examiner

FIG. 4

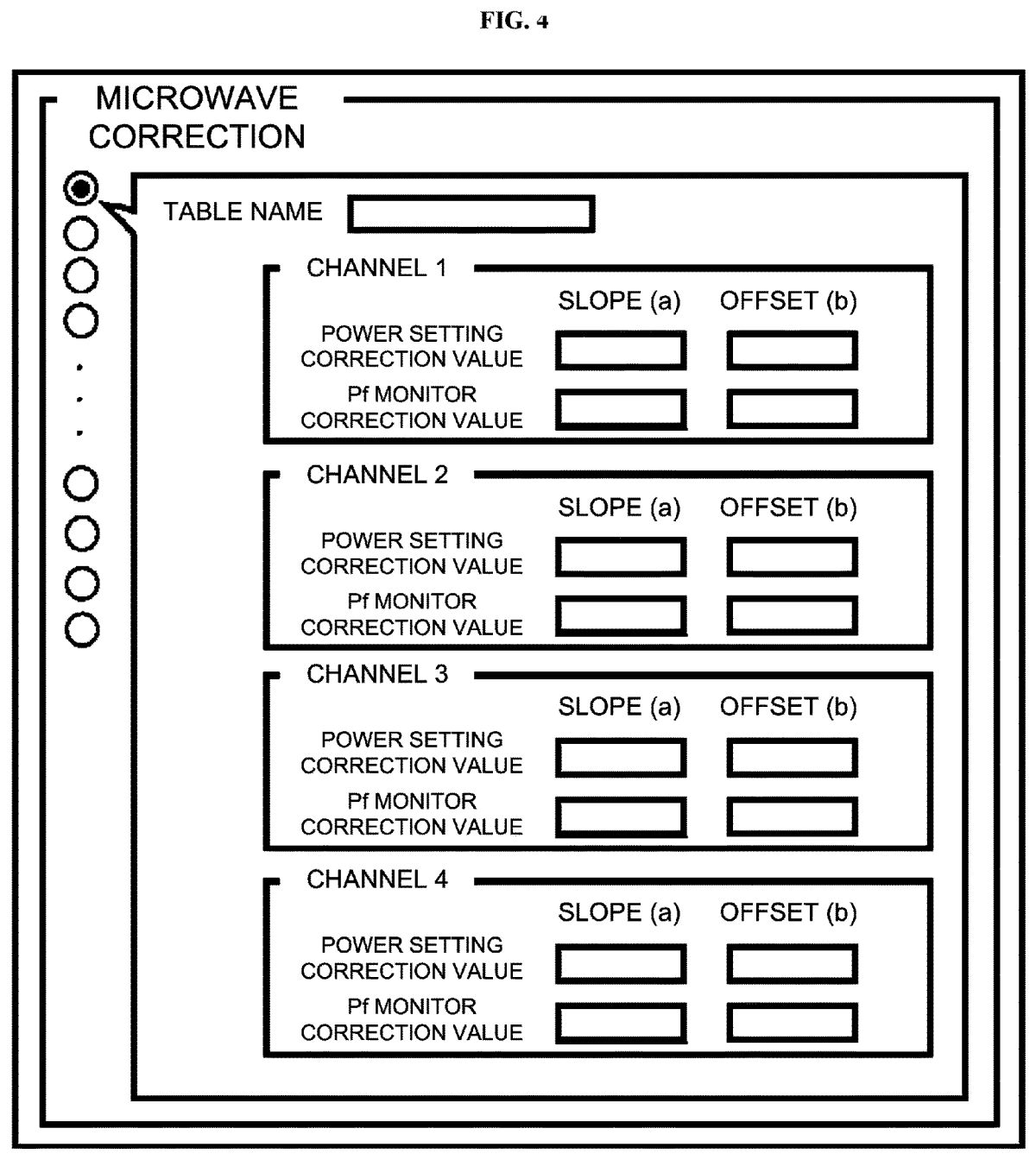

MICROWAVE CORRECTION

TABLE NAME

CHANNEL 1

SLOPE (a) OFFSET (b)

POWER SETTING CORRECTION VALUE

Pf MONITOR CORRECTION VALUE

CHANNEL 2

SLOPE (a) OFFSET (b)

POWER SETTING CORRECTION VALUE

Pf MONITOR CORRECTION VALUE

CHANNEL 3

SLOPE (a) OFFSET (b)

POWER SETTING CORRECTION VALUE

Pf MONITOR CORRECTION VALUE

CHANNEL 4

SLOPE (a) OFFSET (b)

POWER SETTING CORRECTION VALUE

Pf MONITOR CORRECTION VALUE

FIG. 6

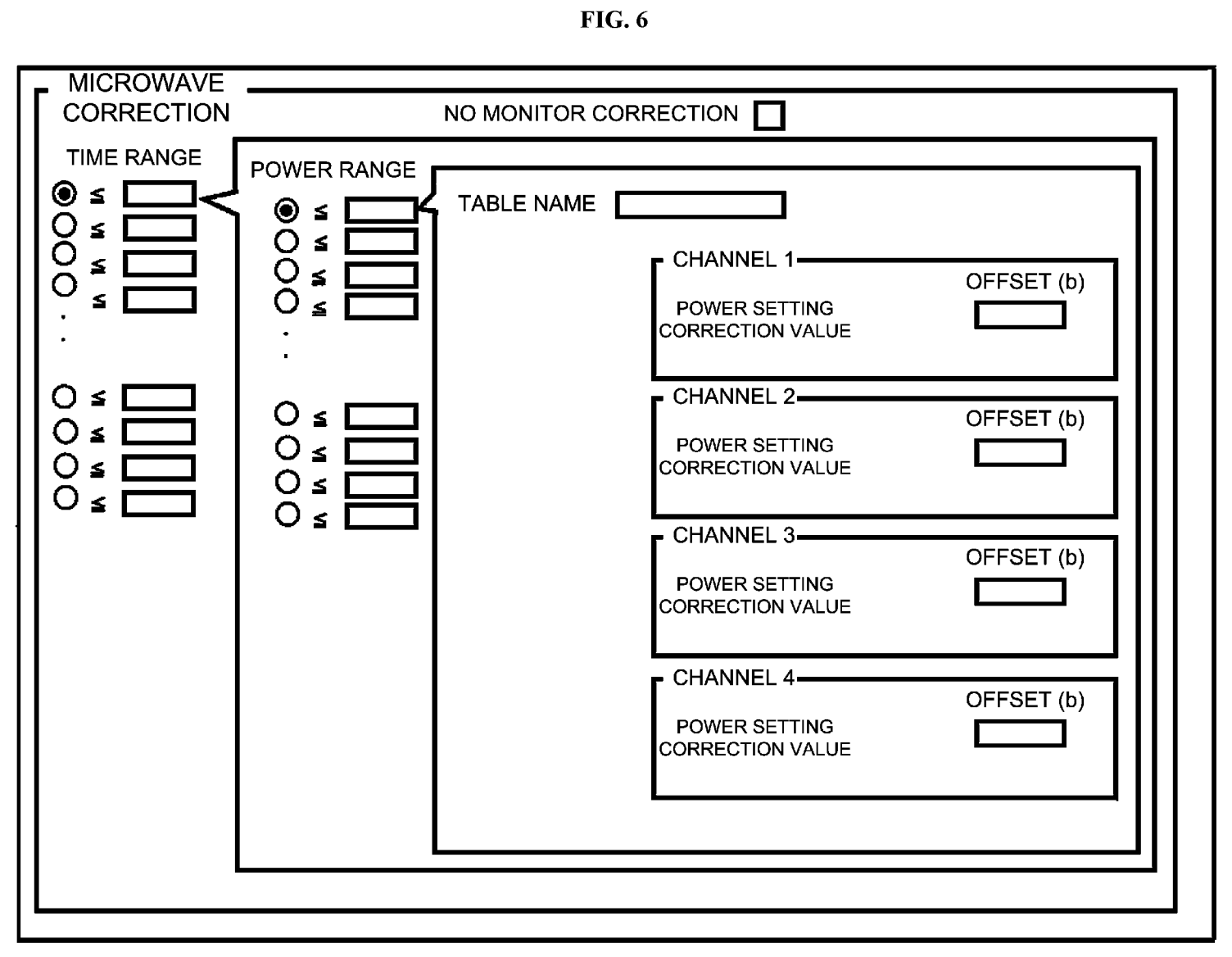

MICROWAVE CORRECTION

NO MONITOR CORRECTION

TIME RANGE

≤ ≤ ≤ ≤ . . ≤ ≤ ≤ ≤

POWER RANGE

≤ ≤ ≤ ≤ . . ≤ ≤ ≤ ≤

TABLE NAME

CHANNEL 1
POWER SETTING CORRECTION VALUE
OFFSET (b)

CHANNEL 2
POWER SETTING CORRECTION VALUE
OFFSET (b)

CHANNEL 3
POWER SETTING CORRECTION VALUE
OFFSET (b)

CHANNEL 4
POWER SETTING CORRECTION VALUE
OFFSET (b)

FIG. 8

CORRECTION VALUE CALCULATION FORMULAS FOR EACH CORRECTION TABLE

| CORRECTION TABLE | CORRECTION VALUE CALCULATION FORMULA | REMARKS |
|---|---|---|
| INTER-APPARATUS MACHINE DIFFERENCE CORRECTION TABLE | CORRECTION VALUE = c * X + d | X: PRESET LEVEL OF MICROWAVE<br>c: CORRECTION COEFFICIENT (SLOPE)<br>d: CORRECTION COEFFICIENT (OFFSET) |
| INTER-PROCESS-MODULE CORRECTION TABLE | CORRECTION VALUE = a * X + b | X: PRESET LEVEL OF MICROWAVE<br>a: CORRECTION COEFFICIENT (SLOPE)<br>b: CORRECTION COEFFICIENT (OFFSET) |
| INTER-PROCESS CORRECTION TABLE | CORRECTION VALUE = X + e | X: PRESET LEVEL OF MICROWAVE<br>e: CORRECTION COEFFICIENT (OFFSET) |

CALCULATION OF CORRECTION VALUE (IN CASE WHERE ONE-SHOT RECIPE IS USED)

ONE-SHOT RECIPE : RECIPE IN WHICH PRESET LEVELS CAN BE CORRECTED DURING FILM-FORMING PROCESS)

| INTER-PROCESS-MODULE CORRECTION TABLE | INTER-PROCESS CORRECTION TABLE | CORRECTION | CORRECTION VALUE CALCULATION FORMULA | REMARKS |
|---|---|---|---|---|
| DOWNLOAD IS NOT COMPLETED | DOWNLOAD IS NOT COMPLETED | POSSIBLE | c * X + d | |
| | DOWNLOAD IS COMPLETED | POSSIBLE | c * X + d + e | |
| DOWNLOAD IS COMPLETED | DOWNLOAD IS NOT COMPLETED | POSSIBLE | c * (a * X + b) + d | |
| | DOWNLOAD IS COMPLETED | POSSIBLE | c * (a * X + b) + d + e | |

IN CASE WHERE PROCESS RECIPE (NOT ONE-SHOT RECIPE) IS PERFORMED

| INTER-PROCESS-MODULE CORRECTION TABLE | INTER-PROCESS CORRECTION TABLE | CORRECTION | CORRECTION VALUE CALCULATION FORMULA | REMARKS |
|---|---|---|---|---|
| DOWNLOAD IS NOT COMPLETED | DOWNLOAD IS NOT COMPLETED | IMPOSSIBLE | - | RECIPE CAN NOT BE PERFORMED |
| | DOWNLOAD IS COMPLETED | IMPOSSIBLE | - | RECIPE CAN NOT BE PERFORMED |
| DOWNLOAD IS COMPLETED | DOWNLOAD IS NOT COMPLETED | POSSIBLE | c * (a * X + b) + d | |
| | DOWNLOAD IS COMPLETED | POSSIBLE | c * (a * X + b) + d + e | |

METHOD OF MANUFACTURING SEMICONDUCTOR DEVICE, SUBSTRATE PROCESSING METHOD, SUBSTRATE PROCESSING APPARATUS AND NON-TRANSITORY COMPUTER-READABLE RECORDING MEDIUM

CROSS REFERENCE TO RELATED APPLICATIONS

This application claims priority under 35 U.S.C. § 119(a)-(d) to Japanese Patent Application No. 2021-156450 filed on Sep. 27, 2021, the entire contents of which are hereby incorporated by reference.

TECHNICAL FIELD

The present disclosure relates to a method of manufacturing a semiconductor device, a substrate processing method, a substrate processing apparatus and a non-transitory computer-readable recording medium.

BACKGROUND

According to some related arts, a substrate may be processed with a microwave in a substrate processing apparatus used in a manufacturing process of a semiconductor device.

However, in a conventional microwave output apparatus, an inner temperature of a process chamber included in the substrate processing apparatus may be lowered due to a machine difference or a difference between processing conditions. Thereby, it may be difficult to stably form a film on the substrate.

SUMMARY

According to the present disclosure, there is provided a technique capable of stably forming a film on a substrate without being affected by a machine difference or processing conditions.

According to an aspect of the present disclosure, there is provided a technique that includes: (a) setting a plurality of correction coefficients for correcting an output level of a microwave; (b) storing, in a memory, a plurality of correction tables in which the plurality of correction coefficients set in (a) are written; (c) acquiring one or more correction coefficients from at least one correction table among the plurality of correction tables periodically from a start of outputting of the microwave; (d) calculating a correction value for an output preset level of the microwave from the one or more correction coefficients acquired in (c); (e) correcting the output preset level of the microwave by using the correction value calculated in (d); and (f) processing a substrate by supplying the microwave into a process chamber with the output preset level of the microwave corrected in (e).

BRIEF DESCRIPTION OF THE DRAWINGS

FIG. 4 is a diagram schematically illustrating a setting screen for an inter-apparatus machine difference correction table (also referred to as a "first correction table").

FIG. 6 is a diagram schematically illustrating a setting screen for an inter-process correction table (also referred to as a "third correction table").

FIG. 8 is a diagram schematically illustrating examples of calculating a correction value.

DETAILED DESCRIPTION

Embodiments of Present Disclosure

Figure 1:
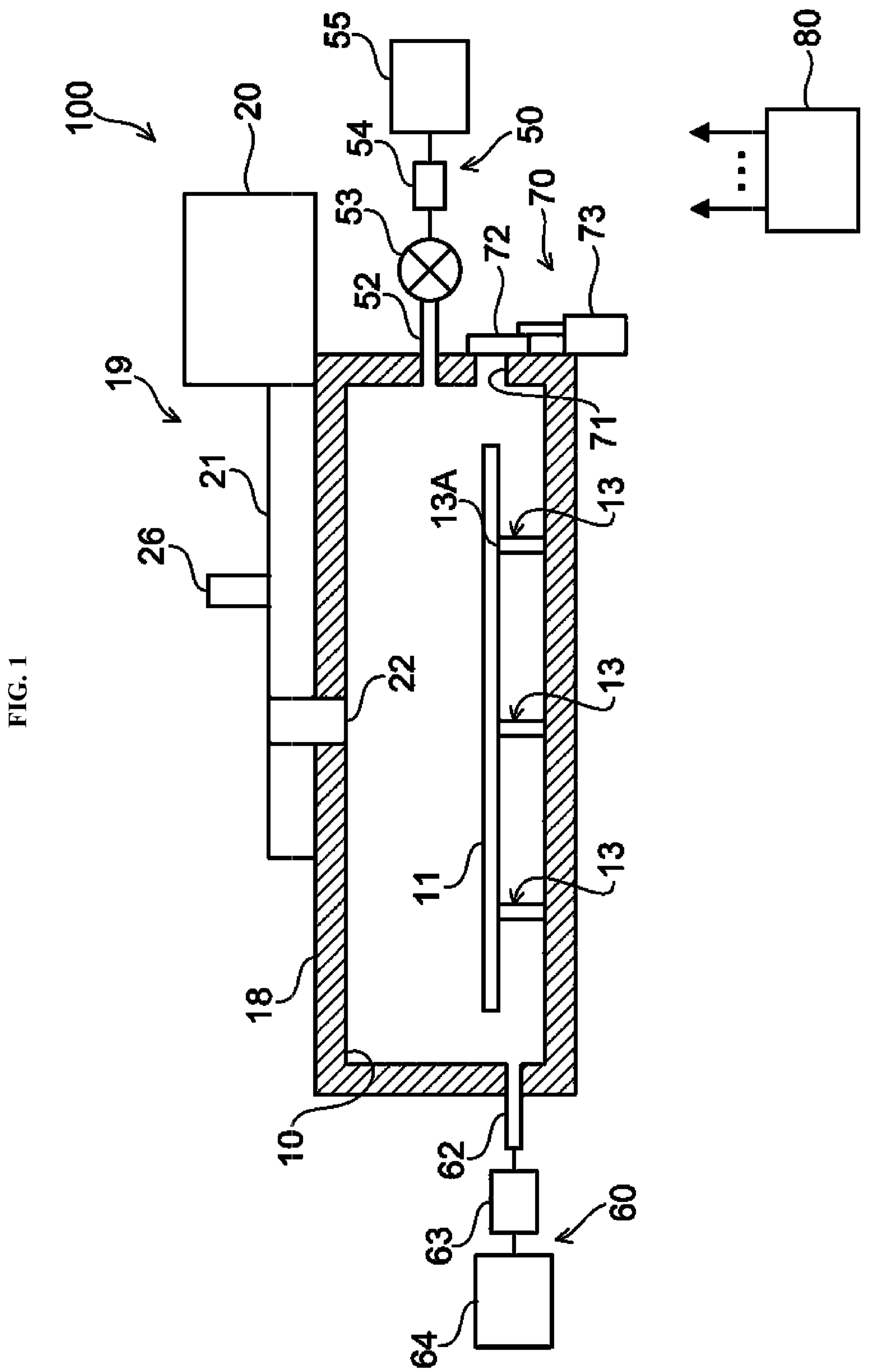
FIG. 1 is a diagram schematically illustrating a vertical cross-section of a process chamber included in a substrate processing apparatus according to one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

FIG. 1 is a diagram schematically illustrating a vertical cross-section of a process chamber 10 included in a substrate processing apparatus 100 according to the embodiments of the present disclosure. The substrate processing apparatus 100 includes the process chamber 10, a transfer chamber (not shown), and a microwave supplier (which is a microwave supply structure or a microwave supply system) 19. The process chamber 10 is configured to process a substrate 11. The microwave supplier 19 includes a waveguide 21 and a waveguide port 22. As the substrate 11, for example, a semiconductor substrate or an LCD substrate may be used. Further, a microwave generator 20 may be further provided at the microwave supplier 19.

The microwave generator 20 generates, for example, a fixed frequency microwave or a variable frequency microwave. For example, a microtron, a klystron or a gyrotron may be used as the microwave generator 20. The microwave generated from the microwave generator 20 can be radiated into the process chamber 10 through the waveguide 21 from the waveguide port 22 communicating with the process chamber 10. Thereby, it is possible to improve an efficiency of a dielectric heating. The waveguide 21 is provided with a matcher (which is a matching structure) 26 capable of reducing a reflected power inside the waveguide 21.

The microwave supplier 19 is constituted by the microwave generator 20, the waveguide 21, the waveguide port 22 and the matcher 26.

A process vessel 18 constituting the process chamber 10 is made of a metal material such as aluminum (Al) and stainless steel (SUS). The process vessel 18 is configured to shield the process chamber 10 and an outside thereof from the microwave.

A substrate support pin 13 serving as a substrate support structure capable of supporting the substrate 11 is installed in the process chamber 10. Specifically, the substrate 11 is supported at an upper end 13A of the substrate support pin 13.

The substrate support pin 13 is made of a material whose conductivity is low and whose electrical insulating property is high. For example, the substrate support pin 13 is made of a material such as quartz, ceramics, sapphire and Teflon (registered mark). When the material described above is used, it is possible to suppress a heating of the substrate support pin 13. As a result, it is possible to suppress a heat escape (or a heat leakage) from the substrate 11 to the substrate support pins 13. By suppressing the heat escape, it is possible to uniformly heat a surface of the substrate 11. Further, by suppressing a heating of the substrate support pin 13, it is possible to prevent the substrate support pin 13 from being thermally deformed. Further, a plurality of substrate support pins including the substrate support pin 13 are provided. Hereinafter, the plurality of substrate support pins including the substrate support pin 13 may also be referred to as "substrate support pins 13". For example, according to the present embodiments, three substrate support pins are provided as the substrate support pins 13.

For example, a gas supply pipe 52 through which a gas such as nitrogen (N2) is supplied is provided at a side wall of the process chamber 10. A gas supply source 55, a flow rate controller 54 capable of adjusting (or regulating) a flow rate of the gas and an opening/closing valve 53 capable of opening and closing a gas flow path are provided at the gas supply pipe 52 from an upstream side toward a downstream side of the gas supply pipe 52 in a gas flow direction. By opening or closing the opening/closing valve 53, the gas is supplied into the process chamber 10 through the gas supply pipe 52 or a supply of the gas is stopped. The gas supplied through the gas supply pipe 52 may be used to lower an oxygen concentration in the process chamber 10 or to cool the substrate 11, or may serve as a purge gas for purging (or pushing out) the gas in the process chamber 10 or for purging an inner atmosphere of the process chamber 10.

A gas supplier (which is a gas supply structure or a gas supply system) 50 is constituted by the gas supply pipe 52, the opening/closing valve 53, the flow rate controller 54 and the gas supply source 55. The flow rate controller 54 and the opening/closing valve 53 are electrically connected to a controller 80, and controlled by the controller 80.

As shown in FIG. 1, a gas exhaust pipe 62 through which the gas in the process chamber 10 is exhausted from the process chamber 10 is provided on the side wall of the process chamber 10 at a lower portion of the process vessel 18. For example, the process vessel 18 is of a rectangular parallelepiped shape. A vacuum pump 64 serving as an exhaust apparatus and a pressure regulating valve 63 are provided at the gas exhaust pipe 62 from an upstream side toward a downstream side of the gas exhaust pipe 62 in the gas flow direction. By adjusting an opening degree of the pressure regulating valve 63, it is possible to adjust (or regulate) an inner pressure of the process chamber 10 to a predetermined value (predetermined pressure). While the present embodiments are described by way of an example in which the process vessel 18 of a rectangular parallelepiped shape is used, the technique of the present disclosure is not limited thereto. For example, the process vessel 18 may be of a cylindrical shape or of a polyhedral shape.

A gas exhauster (which is a gas exhaust structure or a gas exhaust system) 60 is constituted by the gas exhaust pipe 62, the pressure regulating valve 63 and the vacuum pump 64. The pressure regulating valve 63 is electrically connected to the controller 80, and the controller 80 controls a pressure regulating operation of the pressure regulating valve 63.

As shown in FIG. 1, a substrate transfer port 71 through which the substrate 11 is transferred into or out of the process chamber 10 is installed at one side surface of the process vessel 18. A gate valve 72 is installed at the substrate transfer port 71. By opening the gate valve 72 by operating (or driving) a gate valve driving structure 73, the inside of the process chamber 10 is capable of being in communication with an inside of the transfer chamber (not shown). A substrate transfer structure 70 is constituted by the substrate transfer port 71, the gate valve 72 and the gate valve driving structure 73. A transfer robot (not shown) capable of transferring the substrate 11 is installed in the transfer chamber. The transfer robot includes a transfer arm (not shown) on which the substrate 11 is supported when the substrate 11 is being transferred. When the gate valve 72 is open, it is possible to transfer the substrate 11 into the process chamber 10 or into the transfer chamber by the transfer robot.

Figure 2:
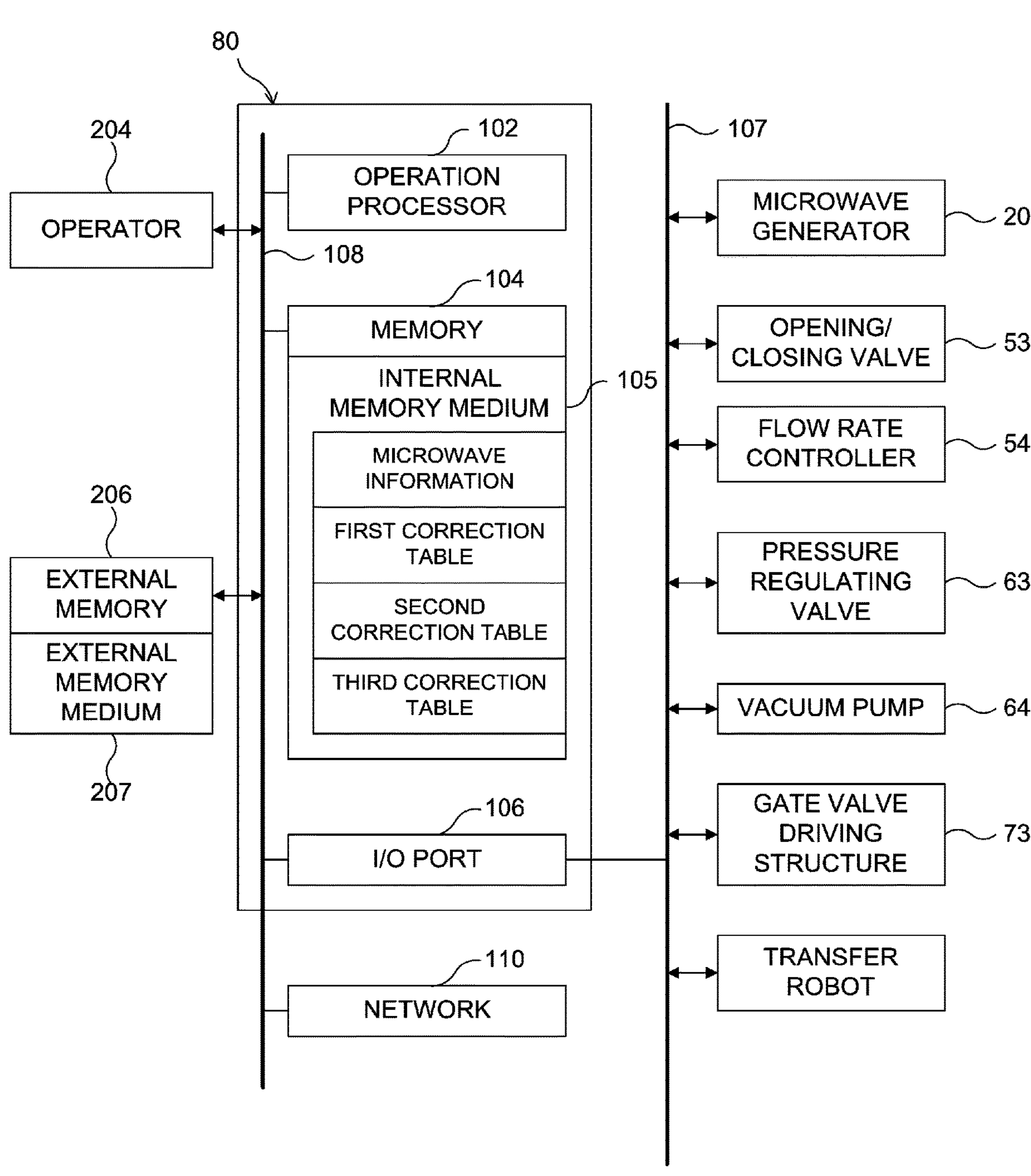
FIG. 2 is a block diagram schematically illustrating a hardware configuration of a controller and related components of the substrate processing apparatus according to the embodiments of the present disclosure.

FIG. 2 is a block diagram schematically illustrating a hardware configuration of the controller 80 and related components. The controller 80 may include an operation processor 102, a memory 104 and an I/O port (input/output port) 106. The operation processor 102, the memory 104 and the I/O port 106 are connected through an internal bus 108 so as to exchange data through an internal bus 108.

As the operation processor 102, a component such as a CPU (Central Processing Unit) and a dedicated operation circuit may be used.

The memory 104 may include an internal memory medium 105. For example, a control program configured to control operations of the substrate processing apparatus 100 or a recipe such as a process recipe containing information on sequences and conditions of a substrate processing described later may be readably stored in the internal memory medium 105.

The process recipe is obtained by combining steps of the substrate processing such that the controller 80 can execute the steps to acquire a predetermined result, and functions as a program. Hereinafter, the process recipe and the control program may be collectively or individually referred to as a "program". Thus, in the present specification, the term "program" may refer to the process recipe alone, may refer to the control program alone, or may refer to both of the process recipe and the control program.

The I/O port 106 is electrically connected to the components described above such as the microwave generator 20, the opening/closing valve 53, the flow rate controller 54, the pressure regulation valve 63, the vacuum pump 64, the gate valve driving structure 73 and the transfer robot via a bus 107. It is possible to transmit corrected preset values (including an output preset level that will be described later) of the microwave described later to the microwave generator 20 via the I/O port 106.

The controller 80 is further connected to a network 110. The network 110 may include a network provided in a semiconductor manufacturing factory, the Internet or the like.

The controller 80 is further connected to an operator (that is, an input/output device 204) and an external memory 206 via the internal bus 108. According to the present embodiments, the input/output device 204 may be integrated with the controller 80. As the input/output device 204, a component such as a display, a touch panel, an operation terminal, a keyboard and a mouse may be used. The external memory 206 may include an external memory medium 207. For example, the control program configured to control the operations of the substrate processing apparatus 100 or the process recipe containing information on the sequences and the conditions of the substrate processing described later may be readably stored in the external memory medium 207.

That is, by executing the program stored in the internal memory medium 105 of the memory 104 by the operation processor 102, the controller 80 is configured to be capable of controlling operations of the components constituting the substrate processing apparatus 100 such as the microwave generator 20, the opening/closing valve 53, the flow rate controller 54, the pressure regulating valve 63, the vacuum pump 64, the gate valve driving structure 73 and a temperature meter (not shown) via the I/O port 106. However, the technique of the present disclosure is not limited thereto. For example, the program may be stored in the external memory 206 provided outside the controller 80, and may be read out from the external memory 206 to be executed. For example, the program stored in the external memory 206 may be moved to the internal memory medium 105, may be read out from the internal memory medium 105 and may be executed. Further, for example, the program may be stored in the internal memory medium 105 by using the network 110 connected to the controller 80 to be executed.

According to the present embodiments, for example, a component such as a hard disk, a CD-ROM and a flash memory may be used as the internal memory medium 105. Further, a component such as a floppy (registered trademark) disk, a CD-ROM, an MO and a flash memory may be used as the external memory medium 207.

Hereinafter, a method of controlling an output level (such as an output power level) of the microwave when the substrate 11 in the substrate processing apparatus 100 is processed (that is, when a heat treatment process is performed according to the present embodiments) by the microwave of the present disclosure will be described with reference to FIGS. 3A, 3B, 8 and 9. Hereinafter, the output level of the microwave may also be referred to as a "microwave output level".

Step S200

First, in a step S200, a plurality of correction coefficients for correcting the microwave output level (and/or an output preset level of the microwave that will be described later) are set. Specifically, the plurality of correction coefficients are capable of being set by using the input/output device 204. According to the present embodiments, as shown in FIG. 2, microwave information, an inter-apparatus machine difference correction table, an inter-process-module correction table and an inter-process correction table are stored in the internal memory medium 105 of the memory 104. The inter-apparatus machine difference correction table is a table for correcting the microwave output level and an actual temperature measured by the temperature meter. Hereinafter, the inter-apparatus machine difference correction table may also be referred to as a "first correction table". The inter-process-module correction table is a table for correcting a drop (decrease) in the microwave output level due to a lapse of time from a start of outputting of the microwave in the microwave generator 20. Hereinafter, the inter-process-module correction table may also be referred to as a "second correction table". Further, the outputting of the microwave may also be referred to as a "microwave output"). The inter-process correction table is a table for correcting a substrate difference for each process. Hereinafter, the inter-process correction table may also be referred to as a "third correction table".

First, by using the input/output device 204, correction coefficients such as a first correction coefficient and a second correction coefficient, which are included in the plurality of the correction coefficients, are set in the first correction table shown in FIG. 4. Specifically, the first correction coefficient for a slope of the output level of the microwave and the second correction coefficient for an offset value of the output level of the microwave are set in the first correction table shown in FIG. 4. Hereinafter, the offset value of the output level of the microwave may also be referred to as a "microwave offset value". In addition, when the substrate processing apparatus 100 includes a plurality of process chambers including the process chamber 10, it is possible to respectively (or individually) set the first correction coefficient and the second correction coefficient in the first correction table for each of a plurality of microwave generators including the microwave generator 20 in each of the plurality of process chambers. Hereinafter, the plurality of process chambers including the process chamber 10 may also be referred to as "process chambers 10", and the plurality of microwave generators including the microwave generator 20 may also be referred to as "microwave generators 20". Alternatively, it is also possible to set common coefficients (the first correction coefficient and the second correction coefficient) commonly shared by the entire microwave generators 20 in the first correction table.

Figure 5:
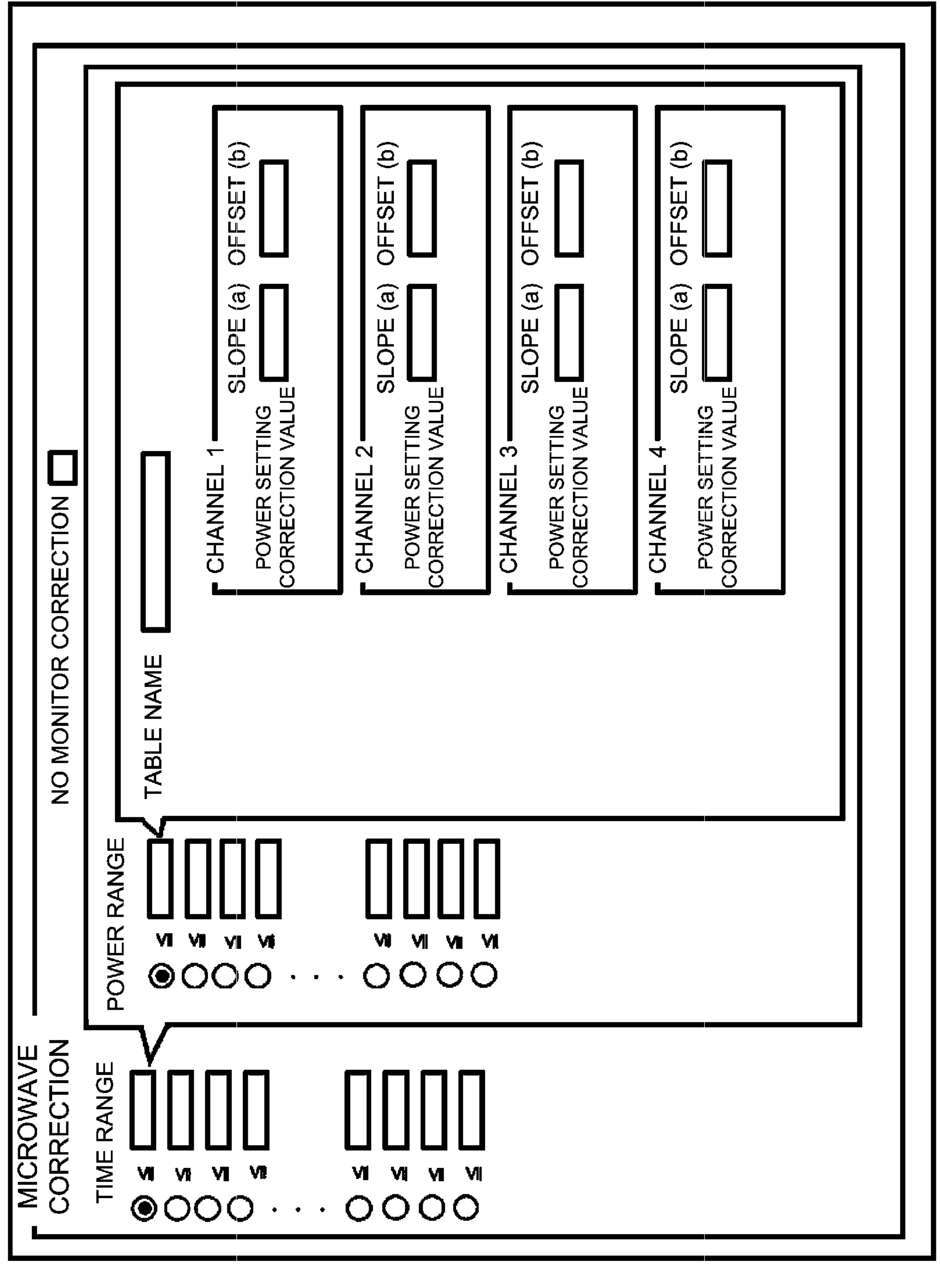
FIG. 5 is a diagram schematically illustrating a setting screen for an inter-process-module correction table (also referred to as a "second correction table").

Subsequently, by using the input/output device 204, correction coefficients such as a third correction coefficient and a fourth correction coefficient, which are included in the plurality of the correction coefficients, are set in the second correction table shown in FIG. 5. Specifically, the third correction coefficient for the slope of the output level of the microwave and the fourth correction coefficient for the microwave offset value are set in the second correction table shown in FIG. 5, respectively, for each elapsed time from the start of the microwave output. In addition, when the substrate processing apparatus 100 includes the process chambers 10, it is possible to respectively (or individually) set the third correction coefficient and the fourth correction coefficient in the second correction table for each of a plurality of process modules (that is, for each of the process chambers 10).

Subsequently, by using the input/output device 204, a correction coefficient such as a fifth correction coefficient, which is included in the plurality of the correction coefficients, is set in the third correction table shown in FIG. 6. Specifically, the fifth correction coefficient is set for the microwave offset value for each elapsed time from the start of the microwave output. In addition, when the substrate processing apparatus 100 includes the plurality of process chambers 10, it is possible to respectively (or individually) set the fifth correction coefficient in the third correction table for each of the plurality of process modules (that is, for each of the process chambers 10).

Step S210

In a step S210, a plurality of correction tables in which the plurality of correction coefficients set in the step S200 are written are stored. Specifically, the first correction table, the second correction table and the third correction table, in which the plurality of correction coefficients related thereto are respectively set in the step S200, are stored in the internal memory medium 105 of the memory 104.

Step S220

Subsequently, in a step S220, one or more correction coefficients are acquired from at least one correction table among the plurality of correction tables periodically from the start of the microwave output. Hereinafter, a process of acquiring the one or more correction coefficients of the microwave and calculating a correction value for an output preset level (such as a preset level of output power) of the microwave may also be referred to as a "correction value acquisition process". In addition, the output preset level of the microwave may also be referred to as a "microwave output preset level".

Figure 3A:
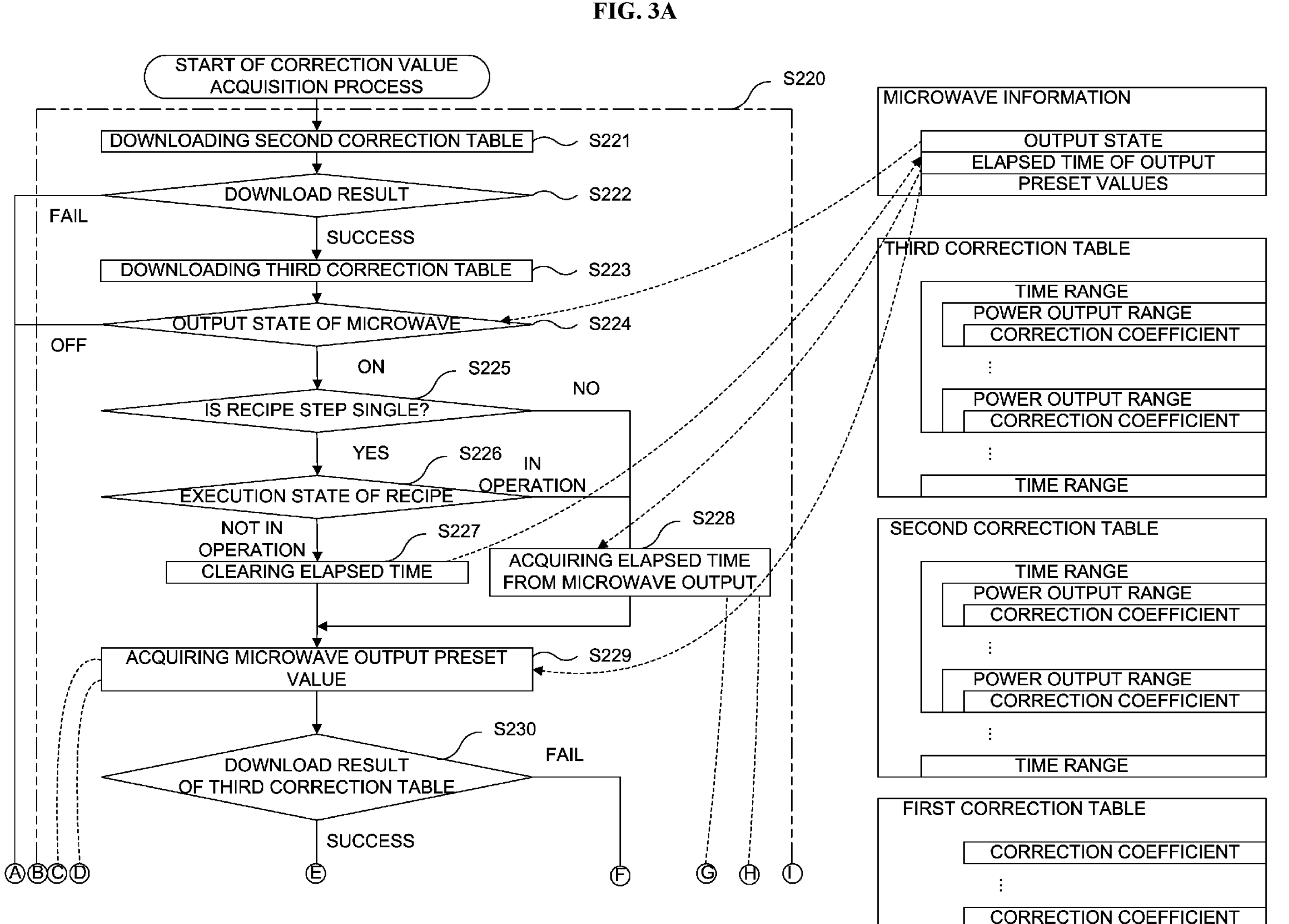
FIGS. 3A and 3B are flow charts specifically illustrating a correction value acquisition process used in the substrate processing apparatus according to the embodiments of the present disclosure.
Figure 3B:
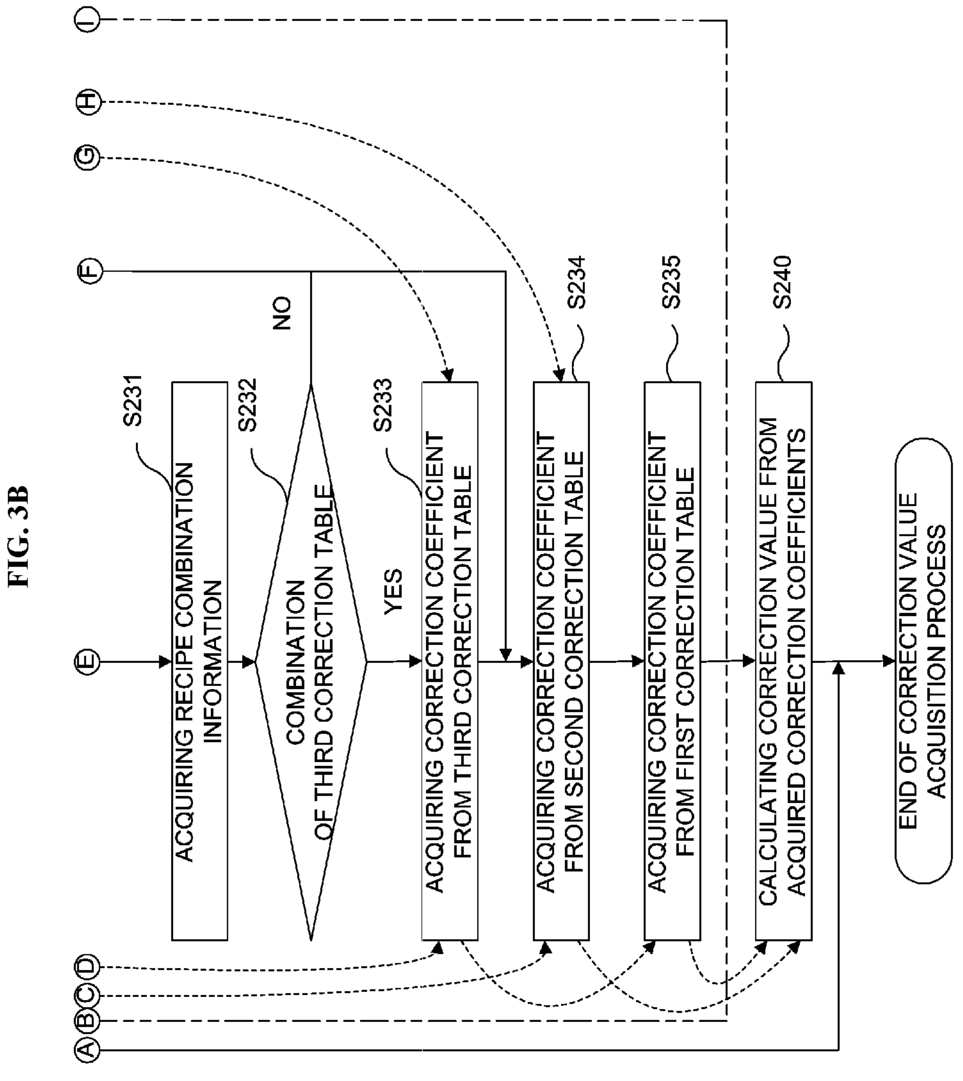

First, as shown in FIGS. 3A and 3B, the second correction table is downloaded (step S221). Subsequently, it is determined whether or not the second correction table is successfully downloaded (step S222). When the second correction table is successfully downloaded, the third correction table is downloaded (step S223). Further, when a download of the second correction table fails, the correction value acquisition process is terminated. In other words, when the second correction table is not available, the microwave preset level is not corrected. In other words, the microwave preset level remains unchanged, or the correction value for the microwave preset level is set to be zero. After downloading the third correction table, an output state of the microwave (that is, an operating state of the microwave generator 20) is determined (step S224). When the microwave generator 20 is not in operation, the correction value acquisition process is terminated. When the microwave generator 20 is in operation and is capable of outputting the microwave, it is determined whether or not a recipe step for the microwave generator 20 is to be executed a single time (step S225). In the step S225, when the recipe step is to be executed a single time, an execution state of the recipe is determined (step S226). When the execution state of the recipe is a state in which the recipe is not being performed (or executed), the elapsed time from the start of the microwave output is cleared or reset to zero (step S227). Thereafter, a step S229 is performed to acquire the microwave output preset level from the internal memory medium 105. Further, in the step S225, when the recipe step is to be executed not a single time (in other words, the recipe step is to be executed a plurality of times), the elapsed time from the start of the microwave output is acquired from the internal memory medium 105 (step S228). Thereafter, the step S229 is performed. Further, in the step S226, when the execution state of the recipe is a state in which the recipe is being performed, the step S228 is performed and the step S229 is performed thereafter.

After acquiring the microwave output preset level from the internal memory medium 105 in the step S229, it is determined whether or not the third correction table is successfully downloaded (step S230). When the third correction table is successfully downloaded, recipe combination information is acquired from the internal memory medium 105 (step S231). In the present specification, procedures (steps) for a process such as a film-forming process is written in the recipe, and it is possible to set items (for the film-forming process) such as a temperature, the flow rate of the gas and a pressure setting for each step. In the present embodiments, the term "combination" refers to information for correcting various setting items set in the recipe in accordance with conditions of an apparatus such as the substrate processing apparatus 100. Subsequently, it is determined whether or not combination information of the third correction table is included in the recipe combination information acquired in the step S231 (step S232). When the combination information of the third correction table is included in the recipe combination information acquired in the step S231, the correction coefficient such as the fifth correction coefficient is acquired from the third correction table (step S233). After the correction coefficient is acquired from the third correction table, the correction coefficients such as the third correction coefficient and the fourth correction coefficient are acquired from the second correction table (step S234). On the other hand, when it is determined in the step S230 that a download of the third correction table fails, the step S234 is performed to acquire the correction coefficients from the second correction table. In other words, when the third correction table is not available, either the second correction table or the first correction table is used to correct the microwave output preset level. After acquiring the correction coefficients from the second correction table, the correction coefficients such as the first correction coefficient and the second correction coefficient are acquired from the first correction table (step S235).

Step S240

Subsequently, the correction value for the microwave output preset level is calculated from the one or more correction coefficients acquired in the step S220. Specifically, the microwave output preset level (that is, the correction value for the microwave output preset level) is calculated by combining the correction coefficients acquired from the first correction table and the correction coefficients acquired from at least one of the second correction table or the third correction table.

Correction value calculation formulas for each correction table are shown in FIG. 8. The correction value in the step S240 is calculated by using the correction value calculation formulas shown in FIG. 8. Further, each correction value calculation formula is stored in the internal memory medium 105. In addition, correction value calculation formulas when the recipe step is to be executed a single time in the step S225 and correction value calculation formulas when the process recipe is performed are shown in FIG. 8. In FIG. 8, "c", "d", "a", "b" and "e" indicate the first, the second, the third, the fourth and the fifth correction coefficient, respectively. The correction value calculation formulas for the first, second and third correction tables are as shown in FIG. 8. Herein, "CORRECTION VALUE=c*X+d" means that the correction value for the microwave output preset level is calculated by adding "d" to the product of "c" and "X". The similar applies to the other correction value calculation formulas. FIG. 8 shows the correction value calculation formulas in a case where the recipe step is to be executed a single time ("one-shot recipe") and the correction value calculation formulas to be used while the process recipe (which is not a one-shot recipe) is being performed. As described in FIG. 8, in case of the one-shot recipe the preset values related thereto can be corrected during the film-forming process. Since the correction value calculation formulas are shown in FIG. 8, detailed descriptions thereof will be omitted by incorporating herein those of FIG. 8.

When the correction value for the microwave output preset level is calculated using the correction value calculation formulas shown in FIG. 8, the correction value acquisition process is terminated.

Step S250

Subsequently, the microwave output preset level is corrected by using the correction value calculated in the step S240.

Step S260

Subsequently, the microwave output preset level corrected based on the correction value is transmitted to the microwave generator 20. The microwave generator 20 generates the microwave by using the microwave output preset level corrected in the step S250. The microwave generated by the microwave generator 20 is supplied into the process chamber 10 to process a film formed on the substrate 11. According to the present embodiments, for example, the heat treatment process of heating the film may be performed.

Figure 7:
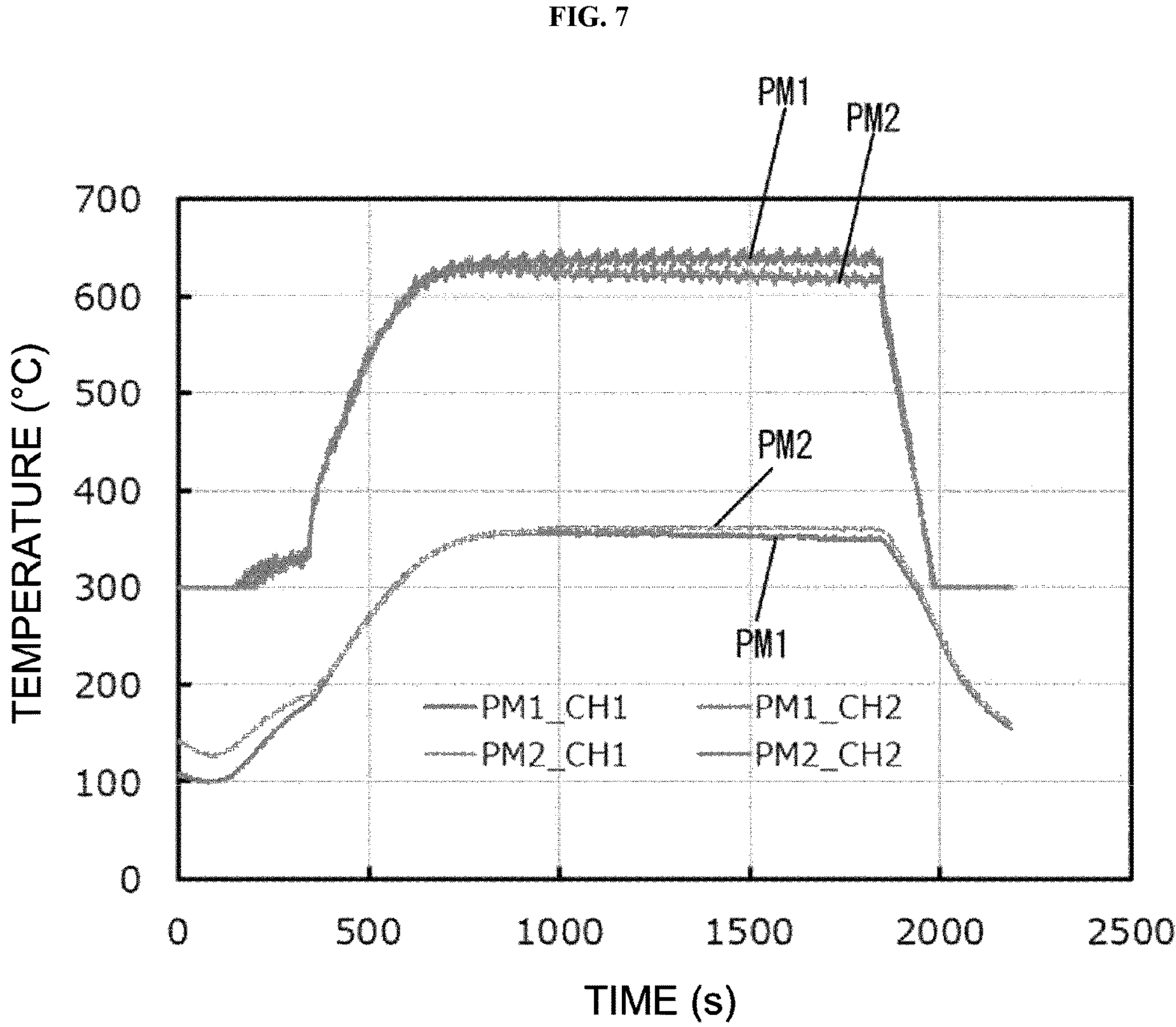
FIG. 7 is a graph schematically illustrating a temperature drop corresponding to a lapse of time from outputting of a microwave.
Figure 9:
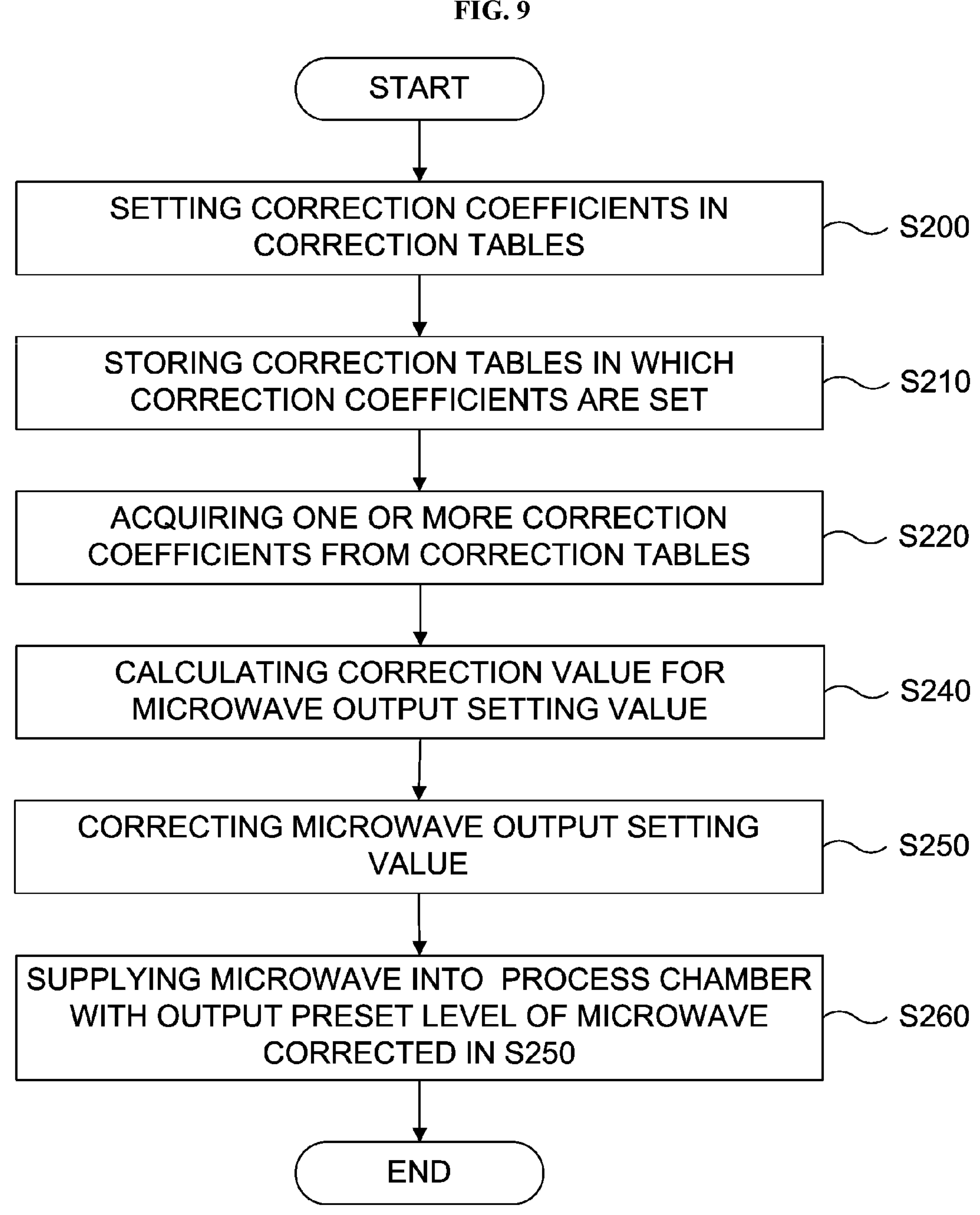
FIG. 9 is a flow chart specifically illustrating a method of controlling an output level of the microwave performed by using the substrate processing apparatus according to the embodiments of the present disclosure.

By periodically and repeatedly performing the steps S220 through S260, the microwave output preset level is optimized as shown in FIG. 7. As a result, it is possible to prevent (or suppress) a temperature of the substrate 11 (or an inner temperature of the process chamber 10) from being lowered due to the elapsed time from the start of the microwave output as compared to a comparative example in which the correction value acquisition process of the present embodiments is not performed. In FIG. 7, "PM1" indicates the comparative example in which the correction value acquisition process of the present embodiments is not performed, and "PM2" indicates an example in which the correction value acquisition process of the present embodiments is performed. Further, values of the correction coefficient are different between "CH1" and "CH2".

A program according to the technique of the present disclosure is a program that causes, by the controller 80 serving as a computer, the substrate processing apparatus 100 to perform: (a) setting a plurality of correction coefficients for correcting an output level of a microwave; (b) storing a plurality of correction tables (which include a first correction table, a second correction table and a third correction table) in which the plurality of correction coefficients set in (a) are written; (c) acquiring one or more correction coefficients from at least one correction table among the plurality of correction tables periodically from a start of outputting of the microwave; (d) calculating a correction value for an output preset level of the microwave from the one or more correction coefficients acquired in (c); (e) correcting the output preset level of the microwave by using the correction value calculated in (d); and (f) processing the substrate 11 by supplying the microwave into the process chamber 10 with the output preset level of the microwave corrected in (e).

Subsequently, actions and effects of the present embodiments will be described. According to the present embodiments, there is provided a method including: (a) acquiring one or more correction coefficients from at least one correction table among a plurality of correction tables (that is, for example, a first correction table, a second correction table and a third correction table), periodically from a start of outputting of a microwave; (b) calculating a correction value for an output preset level of the microwave from the one or more correction coefficients acquired in (a); (c) correcting the output preset level of the microwave by using the correction value calculated in (b); and (d) processing the substrate 11 by supplying the microwave into the process chamber 10 with the output preset level of the microwave corrected in (c). As a result, by correcting the microwave output preset level in accordance with the elapsed time from the start of the microwave output and the microwave output level, it is possible to continuously provide a stable inner temperature of the process chamber 10. Thereby, it is possible to stably perform the film-forming process without being influenced by the conditions of the apparatus between a plurality of apparatuses or between process modules (that is, the process chambers 10).

Further, according to the present embodiments, the first correction table included in the plurality of correction tables is configured such that the first correction coefficient for the slope of the output level of the microwave and the second correction coefficient for the offset value of the output level of the microwave can be set in the first correction table. Thereby, it is possible to perform a correction operation of reducing a difference in the microwave output level between the plurality of apparatuses.

Further, according to the present embodiments, the second correction table included in the plurality of correction tables is configured such that the third correction coefficient for the slope of the output level of the microwave and the fourth correction coefficient for the offset value of the output level of the microwave for each elapsed time from the start of the outputting of the microwave can be set in the second correction table. Thereby, it is possible to perform the correction operation of reducing the difference in the microwave output level between the plurality of process modules.

Further, according to the present embodiments, the third correction table included in the plurality of correction tables is configured such that the fifth correction coefficient for the offset value of the output level of the microwave for each elapsed time from the start of the outputting of the microwave can be set in the third correction table. Thereby, by combining with the recipe for forming the film, it is possible to perform the correction operation of reducing the difference in the microwave output level between each step.

Further, according to the present embodiments, when setting the plurality of correction coefficients, it is possible to set common correction coefficients (the first correction coefficient and the second correction coefficient) that are commonly shared by the entire apparatuses in the first correction table. Thereby, it is possible to reduce the machine difference in the microwave generator 20 between the plurality of apparatuses.

Further, according to the present embodiments, when setting the plurality of correction coefficients, it is possible to set individual correction coefficients (the third correction coefficient and the fourth correction coefficient) respectively for each process module in the second correction table. Therefore, it is possible to reduce the machine difference in the microwave generator 20 between the plurality of process modules.

Further, according to the present embodiments, when setting the plurality of correction coefficients, it is possible to set the fifth correction coefficient individually and respectively for each process module. Thereby, it is possible to reduce the machine difference in the microwave generator 20 between a plurality of processes (or recipes).

Further, according to the present embodiments, the correction value for the output preset level of the microwave is calculated based on the first correction coefficient and the second correction coefficient acquired from the first correction table and at least one of: the third correction coefficient and the fourth correction coefficient acquired from the second correction table; or the fifth correction coefficient acquired from the third correction table. By calculating the correction value by combining the plurality of correction tables as described above, it is possible to correct the output level of the microwave in accordance with the processing conditions. As a result, it is possible to reduce the difference due to the machine difference between the plurality of process modules or due to the machine difference between the plurality of apparatuses.

Further, according to the present embodiments, in a case where the second correction table is not available in acquiring the one or more correction coefficients, the output preset level of the microwave is not corrected. That is, the output preset level of the microwave remains unchanged. Therefore, it is possible to prevent an erroneous correction.

Further, according to the present embodiments, in a case where the third correction table is not available in acquiring the one or more correction coefficients, the output preset level of the microwave is corrected by using at least one of the second correction table or the first correction table. Thereby, it is possible to correct the output preset level of the microwave in accordance with the processing conditions.

Other Embodiments of Present Disclosure

While the technique of the present disclosure is described in detail by way of the embodiments described above, the technique of the present disclosure is not limited thereto. The technique of the present disclosure may be modified in various ways without departing from the scope thereof. For example, the embodiments described above are described by way of an example in which the substrate is processed. However, the technique of the present disclosure is not limited thereto. For example, the technique of the present disclosure may be preferably applied to an object to be processed such as a photomask, a printed wiring board, a liquid crystal panel, a compact disk and a magnetic disk.

According to some embodiments of the present disclosure, it is possible to stably form the film on the substrate without being affected by the machine difference or the processing conditions.

What is claimed is:

1. A substrate processing method, comprising:

(a) setting a plurality of correction coefficients for correcting an output level of a microwave;

(b) storing, in a memory, a plurality of correction tables in which the plurality of correction coefficients set in (a) are written;

(c) acquiring one or more correction coefficients from at least one correction table among the plurality of correction tables periodically from a start of outputting of the microwave;

(d) calculating a correction value for an output preset level of the microwave from the one or more correction coefficients acquired in (c);

(e) correcting the output preset level of the microwave by using the correction value calculated in (d); and (f) processing a substrate by supplying the microwave into a process chamber with the output preset level of the microwave corrected in (e), wherein the plurality of correction coefficients comprise a first correction coefficient for a slope of the output level of the microwave and a second correction coefficient for an offset value of the output level of the microwave, wherein the plurality of correction tables comprise an inter-apparatus machine difference correction table configured such that the first correction coefficient and the second correction coefficient are capable of being set, wherein the plurality of correction tables further comprise at least one selected from the group of an inter-process-module correction table and an inter-process correction table, and the plurality of correction coefficients comprise a third correction coefficient for the slope of the output level of the microwave, a fourth correction coefficient for the offset value of the output level of the microwave and a fifth correction coefficient for the offset value of the output level of the microwave, wherein the inter-process-module correction table is configured such that the third correction coefficient and the fourth correction coefficient are capable of being set for each elapsed time from the start of the outputting of the microwave in the inter-process-module correction table, wherein the inter-process correction table is configured such that the fifth correction coefficient is capable of being set for each elapsed time from the start of the outputting of the microwave in the inter-process correction table, and wherein, in (d), the correction value for the output preset level of the microwave is calculated based on the first correction coefficient and the second correction coefficient acquired from the inter-apparatus machine difference correction table and at least one selected from the group of the third correction coefficient or the fourth correction coefficient acquired from the inter-process-module correction table and the fifth correction coefficient acquired from the inter-process correction table.

2. The method of claim 1, wherein the inter-apparatus machine difference correction table is configured such that the first correction coefficient and the second correction coefficient commonly shared by entire apparatuses are capable of being set in (a) in the inter-process-module correction table.

3. The method of claim 1, wherein, when the inter-process-module correction table is not available in (c), the output preset level of the microwave remains unchanged.

4. The method of claim 1, wherein, when the inter-process correction table is not available in (c), the output preset level of the microwave is corrected in (e) by using at least one selected from the group of the inter-process-module correction table and the inter-apparatus machine difference correction table.

5. The method of claim 1, wherein the inter-process-module correction table is configured such that the third correction coefficient and the fourth correction coefficient are capable of being set in (a) respectively for each process module in the inter-process-module correction table.

6. The method of claim 1, wherein the inter-process correction table is configured such that the fifth correction coefficient is capable of being set in (a) respectively for each recipe defining processing conditions of the substrate in the inter-process correction table.

7. The method of claim 1, wherein the at least one correction table among the plurality of correction tables is capable of being designated as combination information of a recipe defining processing conditions of the substrate.

8. The method of claim 1, wherein, when the outputting of the microwave is not performed, the correction value is assigned as zero.

9. The method of claim 1, wherein the memory is configured to be capable of storing, as microwave information, an output state of the microwave, an elapsed time from the start of the outputting of the microwave and preset values of the microwave.

10. The method of claim 1, wherein an elapsed time from the start of the outputting of the microwave output is cleared when the substrate is not processed.

11. A substrate processing apparatus comprising:

a process chamber in which a substrate is processed;

a microwave generator configured to be capable of supplying a microwave into the process chamber with an output preset level of the microwave;

an operator configured to be capable of setting a plurality of correction coefficients for correcting an output level of the microwave;

a memory configured to be capable of storing a plurality of correction tables in which the plurality of correction coefficients set by the operator are written; and an operation processor configured to be capable of performing:

(a) acquiring one or more correction coefficients from at least one correction table among the plurality of correction tables periodically from a start of outputting of the microwave;

(b) calculating a correction value for the output preset level of the microwave from the one or more correction coefficients acquired in (a); and (c) correcting the output preset level of the microwave by using the correction value calculated in (b), wherein the plurality of correction coefficients comprise a first correction coefficient for a slope of the output level of the microwave and a second correction coefficient for an offset value of the output level of the microwave, wherein the plurality of correction tables comprise an inter-apparatus machine difference correction table configured such that the first correction coefficient and the second correction coefficient are capable of being set, wherein the plurality of correction tables further comprise at least one selected from the group of an inter-process-module correction table and an inter-process correction table, and the plurality of correction coefficients comprise a third correction coefficient for the slope of the output level of the microwave, a fourth correction coefficient for the offset value of the output level of the microwave and a fifth correction coefficient for the offset value of the output level of the microwave, wherein the inter-process-module correction table is configured such that the third correction coefficient and the fourth correction coefficient are capable of being set for each elapsed time from the start of the outputting of the microwave in the inter-process-module correction table, wherein the inter-process correction table is configured such that the fifth correction coefficient is capable of being set for each elapsed time from the start of the outputting of the microwave in the inter-process correction table, and wherein, in (d), the correction value for the output preset level of the microwave is calculated based on the first correction coefficient and the second correction coefficient acquired from the inter-apparatus machine difference correction table and at least one selected from the group of the third correction coefficient or the fourth correction coefficient acquired from the inter-process-module correction table and the fifth correction coefficient acquired from the inter-process correction table.

12. A non-transitory computer-readable recording medium storing a program that causes, by a computer, a substrate processing apparatus to perform:

(a) setting a plurality of correction coefficients for correcting an output level of a microwave;

(b) storing a plurality of correction tables in which the plurality of correction coefficients set in (a) are written;

(c) acquiring one or more correction coefficients from at least one correction table among the plurality of correction tables periodically from a start of outputting of the microwave;

(d) calculating a correction value for an output preset level of the microwave from the one or more correction coefficients acquired in (c);

(e) correcting the output preset level of the microwave by using the correction value calculated in (d); and (f) processing a substrate by supplying the microwave into a process chamber with the output preset level of the microwave corrected in (e), wherein the plurality of correction coefficients comprise a first correction coefficient for a slope of the output level of the microwave and a second correction coefficient for an offset value of the output level of the microwave, wherein the plurality of correction tables comprise an inter-apparatus machine difference correction table configured such that the first correction coefficient and the second correction coefficient are capable of being set, wherein the plurality of correction tables further comprise at least one selected from the group of an inter-process-module correction table and an inter-process correction table, and the plurality of correction coefficients comprise a third correction coefficient for the slope of the output level of the microwave, a fourth correction coefficient for the offset value of the output level of the microwave and a fifth correction coefficient for the offset value of the output level of the microwave, wherein the inter-process-module correction table is configured such that the third correction coefficient and the fourth correction coefficient are capable of being set for each elapsed time from the start of the outputting of the microwave in the inter-process-module correction table, wherein the inter-process correction table is configured such that the fifth correction coefficient is capable of being set for each elapsed time from the start of the outputting of the microwave in the inter-process correction table, and wherein, in (d), the correction value for the output preset level of the microwave is calculated based on the first correction coefficient and the second correction coefficient acquired from the inter-apparatus machine difference correction table and at least one selected from the group of the third correction coefficient or the fourth correction coefficient acquired from the inter-process-module correction table and the fifth correction coefficient acquired from the inter-process correction table.

13. A method of manufacturing a semiconductor device, comprising:

the method of claim 1.

* * * * *